United States Patent
Zhou et al.

(10) Patent No.: US 7,290,189 B2
(45) Date of Patent: Oct. 30, 2007

(54) COMPILATION OF CALIBRATION INFORMATION FOR PLURAL TESTFLOWS

(75) Inventors: Zhengrong Zhou, Santa Rosa, CA (US); Yi Xu, Santa Rosa, CA (US); Kai Yick, Elk Grove, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 228 days.

(21) Appl. No.: 11/091,681

(22) Filed: Mar. 28, 2005

(65) Prior Publication Data

US 2006/0236167 A1 Oct. 19, 2006

(51) Int. Cl.
G01R 31/28 (2006.01)
(52) U.S. Cl. .................... 714/724; 702/118
(58) Field of Classification Search ............. 716/4; 702/85, 108, 122, 118; 714/724
See application file for complete search history.

(56) References Cited

U.S. PATENT DOCUMENTS

| | | | | |
|---|---|---|---|---|
| 5,400,263 | A * | 3/1995 | Rohrbaugh et al. | 716/4 |
| 5,426,585 | A * | 6/1995 | Stepper et al. | 702/85 |
| 6,367,041 | B1 * | 4/2002 | Statovici et al. | 714/724 |
| 7,076,388 | B2 * | 7/2006 | Kolman et al. | 702/108 |
| 7,113,883 | B1 * | 9/2006 | House et al. | 702/122 |

* cited by examiner

Primary Examiner—David Ton

(57) ABSTRACT

In one embodiment, a selection of plural testflows is first obtained. Each testflow specifies how automated test equipment (ATE) should test at least one device. Calibration information is then identified for each of the testflows, and redundancies in the identified calibration information are eliminated to compile a set of non-redundant information for performing a focused calibration over the ATE and selected testflows.

20 Claims, 2 Drawing Sheets

COMPILATION OF CALIBRATION INFORMATION FOR PLURAL TESTFLOWS

BACKGROUND

Prior to the manufacture and/or distribution of an electrical device (including a system or component such as a circuit board, integrated circuit, or system-on-a-chip (SOC)), the device is typically tested to determine whether it is built or functions as designed. Often, this testing is performed by automated test equipment (ATE, also called "testers").

For the results of ATE to be meaningful, ATE needs to be calibrated. That is, the intrinsic system errors that ATE may introduce during testing under different conditions and test setups must be quantified. The data which quantifies ATE's intrinsic system errors is often referred to as "calibration data" and may comprise one or more "calibration factors". Once generated, calibration data is used to remove ATE's intrinsic system errors from raw test data.

One way to characterize ATE's intrinsic system errors is to measure them directly. Often, this sort of calibration involves the coupling of various ATE probes to one or more known-good "calibration standards", taking a measurement, and then comparing the measurement result to an expected measurement result.

Another way to characterize ATE's intrinsic system errors is to model them via a mathematic model. Calibration data may then be calculated from the model (although it may still be necessary to acquire certain measurements using one or more calibration standards).

Calibration data generally falls into two categories: 1) "system calibration data", which characterizes the core structure of ATE (e.g., the instruments and base structures of ATE—typically those parts of the ATE that are re-used when testing different devices), and 2) "focused calibration data", which characterizes the ATE under different test setups. Test setups may specify, for example, both the physical and electrical parameters under which testing will occur, including, for example, indications of the ATE test paths that will be used during testing, as well as their configuration (including, e.g., identifications of stimulus and/or measurement paths, and indications of which ATE pins will be coupled to which pins of a device); indications of testing frequencies (including, e.g., a test frequency range); indications of modulation formats; indications of measurement bandwidths; or indications of power or voltage levels.

SUMMARY OF THE INVENTION

In one embodiment, a computer-implemented method comprises 1) obtaining a selection of plural testflows, each of which specifies how ATE should test at least one device; 2) identifying calibration information for each of the testflows; and 3) eliminating redundancies in the identified calibration information to compile a set of non-redundant information for performing a focused calibration over the ATE and selected testflows.

Other embodiments are also disclosed.

BRIEF DESCRIPTION OF THE DRAWINGS

Illustrative embodiments of the invention are illustrated in the drawings, in which.

DETAILED DESCRIPTION

Figure 1:
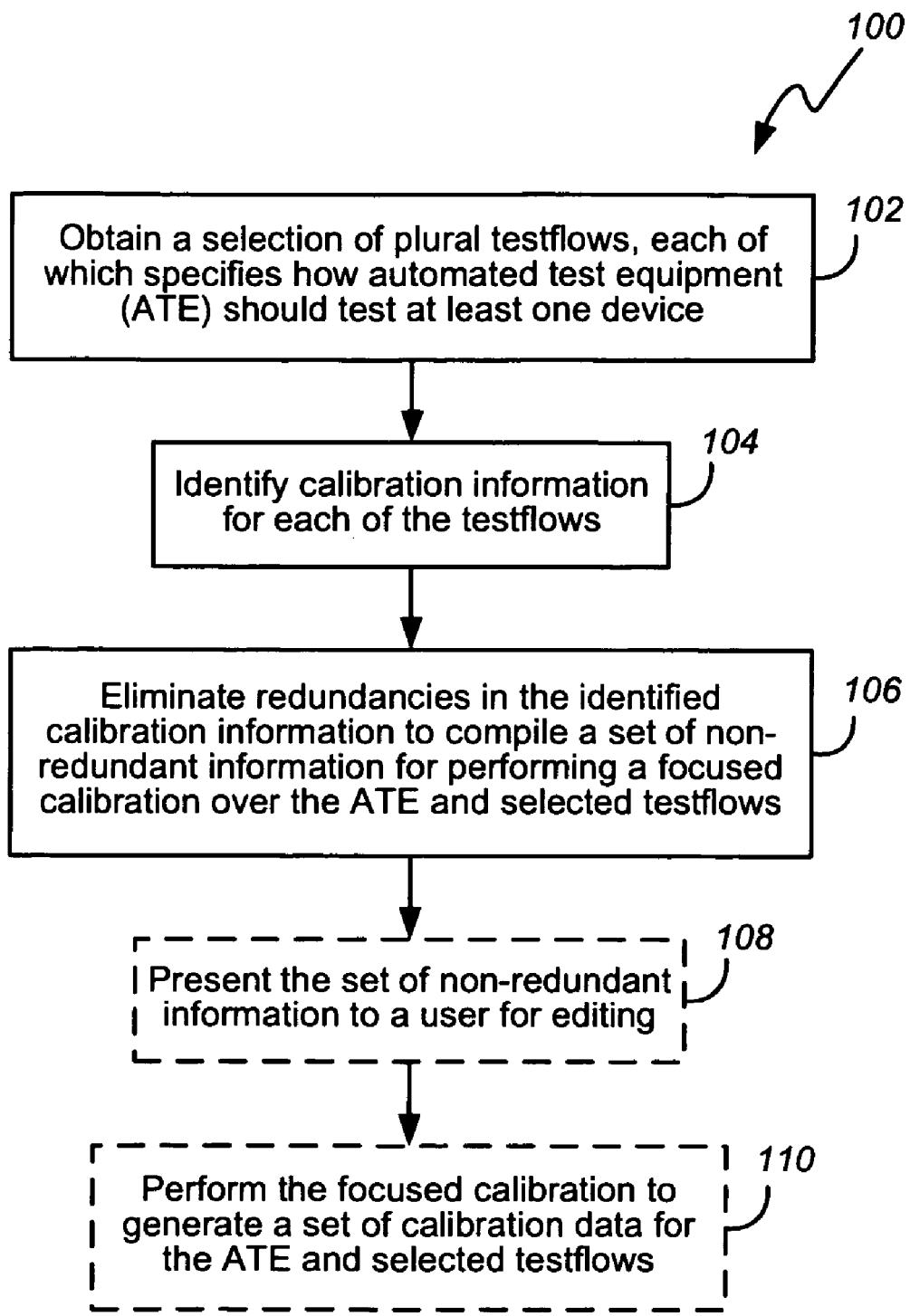
FIG. 1 illustrates an exemplary computer-implemented method for performing focused calibration for plural testflows.

As a result of drifts in the characteristics of ATE, ATE must be periodically recalibrated. When it comes to focused calibration, this means performing a separate focused calibration process for each testflow of each device that is to be tested using the ATE. Thus, for example, if ATE is used to test three devices, each of which is tested using a set of five device-specific testflows, fifteen different focused calibration processes need to be performed on a periodic basis. To reduce the overhead associated with performing these focused calibration processes, FIG. 1 illustrates a novel, computer-implemented method for performing focused calibration for plural testflows.

As defined herein, a "testflow" is any portion of a test program that specifies how ATE should test at least one device. By way of example, a testflow may specify the type, number and order of tests that are to be executed by ATE.

The method 100 commences with obtaining 102 a selection of plural testflows. In one embodiment, this is done by prompting a user to provide a selection of testflows. In some cases, this may be done by presenting the user with a list of testflows from which the user may select the testflows (e.g., by displaying a custom listing, or by simply displaying a directory structure (or file paths) in which the testflows are stored). In other cases, the user may be prompted by presenting the user a list of devices. In this manner, the user's selection of one or more devices may be interpreted as a selection of the testflows that are associated with the device.

Figure 2:
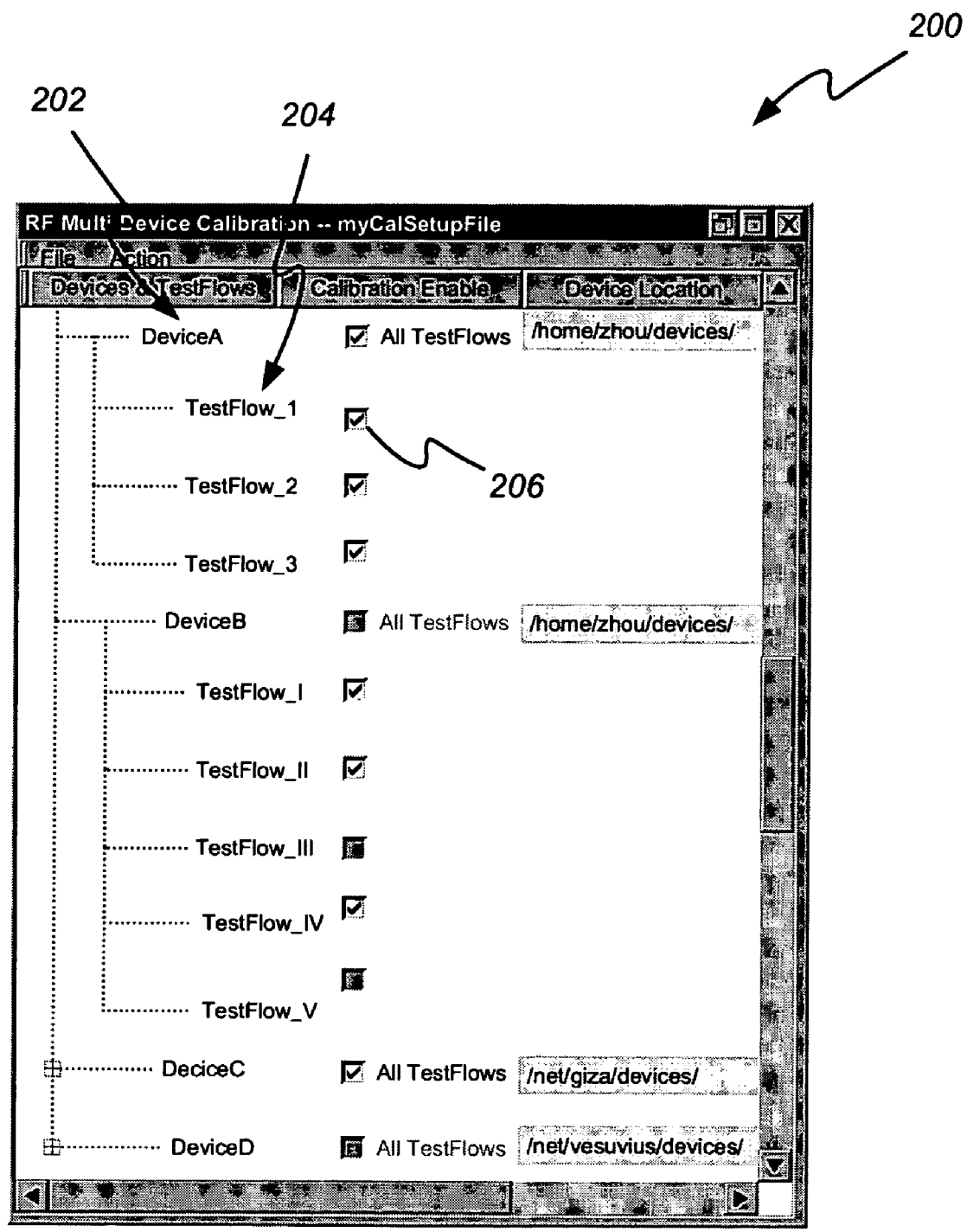
FIG. 2 illustrates an exemplary graphical user interface by which a user may be prompted to select testflows in accord with the FIG. 1 method.

As shown in FIG. 2, a user may also be prompted to select testflows by means of a graphical user interface (GUI 200) that displays lists 202, 204 of devices, as well as their associated testflows. In this manner, the user may select testflows both individually and by device (e.g., via associated checkboxes 206 or radio buttons).

In another embodiment, the method 100 obtains a selection of testflows from a file, or from another process or application.

After obtaining the selection of plural testflows, the method 100 continues with the identification 104 of calibration information for each of the testflows. The calibration information may comprise any information that is pertinent to performing a focused calibration process, including, for example, test setups such as indications of the ATE test paths that will be used during testing, as well as their configuration (including, e.g., identifications of stimulus and/or measurement paths, and indications of which ATE pins will be coupled to which pins of a device); indications of testing frequencies (including, e.g., a test frequency range); indications of modulation formats; indications of measurement bandwidths; or indications of power or voltage levels. In most cases, calibration information will be identified directly from the selected testflows. However, calibration information may sometimes be identified from other sources.

After (or while) identifying calibration information, redundancies in the identified calibration information are eliminated 106 so as to compile a set of non-redundant information for performing a focused calibration over the ATE and selected testflows. In this manner, the focused calibration may be performed more efficiently than if a plurality of calibration processes are performed for each of a plurality of testflows. In some cases, redundant calibration information may be eliminated as calibration information is identified. In other cases, redundant calibration information may not be eliminated until all calibration information has been identified and accumulated.

In one embodiment, redundancies in calibration information are eliminated by identifying calibration information specifying the same hardware requirements. Alternately, redundancies may be eliminated by identifying calibration information specifying the same test setups (which may include the identification of like hardware requirements). Redundancies may also be eliminated by identifying calibration information specifying hardware requirements or test setups having defined similarities.

In some cases, the set of non-redundant information compiled by the method 100 may be presented 108 to a user for editing. With or without editing, the method 100 may then perform 110 the focused calibration to generate a set of calibration data for the ATE and selected testflows.

The method 100 may be implemented by distributing, loading or installing sequences of instructions stored on a number of machine-readable media (e.g., one or more fixed or removable memories or disks). When executed by a machine (e.g., a computer or computer network), the sequences of instructions may then cause the machine to perform the actions of the method.

What is claimed is:

1. A computer-implemented method, comprising:
    obtaining a selection of plural testflows, each of which specifies how automated test equipment (ATE) should test at least one device;
    identifying calibration information for each of the testflows; and
    eliminating redundancies in the identified calibration information to compile a set of non-redundant information for performing a focused calibration over the ATE and selected testflows.

2. The method of claim 1, wherein the selection of plural testflows is obtained by prompting a user to provide a selection of testflows.

3. The method of claim 2, wherein said prompting comprises presenting the user a list of testflows from which the user may select testflows.

4. The method of claim 1, wherein the plural testflows correspond to plural devices.

5. The method of claim 1, wherein redundancies in the identified calibration information are eliminated by identifying calibration information specifying the same hardware requirements.

6. The method of claim 1, wherein redundancies in the identified calibration information are eliminated by identifying calibration information specifying test hardware having defined similarities.

7. The method of claim 1, wherein redundancies in the identified calibration information are eliminated by identifying calibration information specifying the same test setups.

8. The method of claim 1, wherein redundancies in the identified calibration information are eliminated by identifying calibration information specifying test setups having defined similarities.

9. The method of claim 1, further comprising, performing the focused calibration to generate a set of calibration data for the ATE and selected testflows.

10. A number of machine-readable media having stored thereon sequences of instructions that, when executed by a machine, cause the machine to perform the actions of:
    obtaining a selection of plural testflows, each of which specifies how automated test equipment (ATE) should test at least one device;
    identifying calibration information for each of the testflows; and
    eliminating redundancies in the identified calibration information to compile a set of non-redundant information for performing a focused calibration over the ATE and selected testflows.

11. The media of claim 10, wherein the selection of plural testflows is obtained by prompting a user to provide a selection of testflows.

12. The media of claim 11, wherein said prompting comprises presenting the user a list of testflows from which the user may select testflows.

13. The media of claim 11, wherein said prompting comprises presenting the user a list of devices.

14. The media of claim 11, wherein said prompting comprises presenting the user a list of devices and their associated testflows.

15. The media of claim 10, wherein the sequences of instructions eliminate redundancies in the identified calibration information by identifying calibration information specifying the same hardware requirements.

16. The media of claim 10, wherein the sequences of instructions eliminate redundancies in the identified calibration information by identifying calibration information specifying test hardware having defined similarities.

17. The media of claim 10, wherein the sequences of instructions eliminate redundancies in the identified calibration information by identifying calibration information specifying the same test setups.

18. The media of claim 10, wherein the sequences of instructions eliminate redundancies in the identified calibration information by identifying calibration information specifying test setups having defined similarities.

19. The media of claim 10, wherein the sequences of instructions further cause the machine to perform the action of:
    performing the focused calibration to generate a set of calibration data for the ATE and selected testflows.

20. The media of claim 10, wherein the sequences of instructions further cause the machine to perform the actions of:
    presenting the set of non-redundant information to a user for editing.

* * * * *